United States Patent
Shimada

(10) Patent No.: US 9,708,729 B2
(45) Date of Patent: Jul. 18, 2017

(54) APPARATUS FOR MANUFACTURING SINGLE CRYSTAL

(71) Applicant: SHIN-ETSU HANDOTAI CO., LTD., Tokyo (JP)

(72) Inventor: Toshiro Shimada, Nagaoka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 252 days.

(21) Appl. No.: 14/401,345

(22) PCT Filed: Apr. 25, 2013

(86) PCT No.: PCT/JP2013/002804
§ 371 (c)(1),
(2) Date: Nov. 14, 2014

(87) PCT Pub. No.: WO2013/183218
PCT Pub. Date: Dec. 12, 2013

(65) Prior Publication Data
US 2015/0136018 A1    May 21, 2015

(30) Foreign Application Priority Data
Jun. 4, 2012    (JP) .................................. 2012-126678

(51) Int. Cl.
*C30B 15/10*    (2006.01)
*C30B 35/00*    (2006.01)
(Continued)

(52) U.S. Cl.
CPC ............. *C30B 15/10* (2013.01); *C30B 15/00* (2013.01); *C30B 15/14* (2013.01); *C30B 29/06* (2013.01);
(Continued)

(58) Field of Classification Search
CPC ......... C30B 15/14; C30B 15/00; C30B 15/10; C30B 35/00; Y10T 117/1032
See application file for complete search history.

(56) References Cited

U.S. PATENT DOCUMENTS 5,887,015 A * 3/1999 Mitamura ............... C30B 15/14
117/30
2002/0157602 A1 10/2002 Mizuishi et al.

FOREIGN PATENT DOCUMENTS

CN     201567389 U    9/2010
CN     102220630 A    10/2011
(Continued)

OTHER PUBLICATIONS

European Patent Office, English Computer translation of JP 2009-215126 (2016).*
(Continued)

*Primary Examiner* — Matthew Song
(74) *Attorney, Agent, or Firm* — Oliff PLC

(57) ABSTRACT

The present invention provides an apparatus for manufacturing a single crystal according to a Czochralski method, including: a crucible configured to contain a raw material melt; a cylindrical heater surrounding the crucible, the heater being configured to heat the raw material melt; a main chamber that accommodates the crucible and the heater; an electrode that is inserted from the bottom of the main chamber and supports the cylindrical heater, the electrode being configured to supply electric power to the heater; and a melt-leakage receiving tray disposed on the bottom of the main chamber, the tray being configured to receive the raw material melt leaking from the crucible, wherein a melt-leakage cover is disposed below the crucible and above the electrode, the cover being configured to prevent contact between the raw material melt leaking from the crucible and the electrode.

4 Claims, 3 Drawing Sheets

(51) Int. Cl.
C30B 15/00 (2006.01)
C30B 29/06 (2006.01)
C30B 15/14 (2006.01)

(52) U.S. Cl.
CPC ......... *C30B 35/00* (2013.01); *Y10T 117/1032* (2015.01); *Y10T 117/1068* (2015.01)

(56) References Cited

FOREIGN PATENT DOCUMENTS

| | | |
|---|---|---|
| EP | 0 781 871 A2 | 7/1997 |
| JP | A-9-183689 | 7/1997 |
| JP | A-2002-137997 | 5/2002 |
| JP | 2009215126 A * | 9/2009 ............ C30B 15/00 |
| JP | A-2009-215126 | 9/2009 |
| WO | WO 01/64976 A1 | 9/2001 |

OTHER PUBLICATIONS

May 4, 2016 Office Action issued in Chinese Patent Application No. 201380029424.4.
International Search Report issued in International Application No. PCT/JP2013/002804 mailed Jun. 4, 2013.
Oct. 20, 2015 Office Action issued in Japanese Patent Application No. 2012-126678.
Dec. 18, 2014 International Preliminary Report on Patentability issued in International Application No. PCT/JP2013/002804.
Jun. 9, 2015 Office Action Issued in Japanese Patent Application No. 2012-126678.

* cited by examiner

APPARATUS FOR MANUFACTURING SINGLE CRYSTAL

TECHNICAL FIELD

The present invention relates to an apparatus for manufacturing a single crystal according to the Czochralski method (the CZ method).

BACKGROUND ART

Substrates that are mainly used in fabrication of very large scale integrated semiconductor devices are silicon wafers with mirror-polished surfaces that are made from silicon single crystal grown by the CZ method. As the diameter of silicon wafers are enlarged to reduce fabrication cost of semiconductor devices, apparatus for manufacturing a single crystal and components in its furnace become increasingly larger.

An exemplary apparatus for manufacturing a single crystal according to the CZ method that is conventionally used, for example, in manufacture of semiconductor silicon single crystals will now be described with reference to FIG. 4.

As shown in FIG. 4, the apparatus 101 for manufacturing a single crystal includes a main chamber (a pulling chamber) 102, a crucible 103 accommodated in the main chamber 102, a cylindrical heater 104 disposed so as to surround the crucible 103, a crucible holding shaft 105 and its rotation mechanism (not shown) for rotating the crucible 103, a seed chuck 107 for holding a silicon seed crystal 106, a wire 108 for pulling the seed chuck 107, and a winding mechanism (not shown) for rotating or winding the wire 108.

The crucible 103 is composed of a quartz crucible disposed on the inside on which a raw material melt (herein, a silicon melt) 109 is received and a graphite crucible disposed on the outside. A heat-insulating material 110 is disposed around the outside of the cylindrical heater 104. A heat-insulating plate 111 is disposed at a bottom portion.

Next, a method for growing a single crystal with the above apparatus 101 for manufacturing a single crystal will be described.

A polycrystalline silicon raw material with high purity is first heated to a melting point (about 1420° C.) or more in the crucible 103 and melted. The wire 108 is then reeled out such that the tip of the seed crystal 106 is brought into contact with or dipped into the melt at substantially the center of the melt surface. After that, while the crucible holding shaft 105 are rotated in the appropriate direction, the wire 108 is reeled up with the wire rotated to pull the seed crystal 106. The growth of the single crystal begins with this procedure. The pulling rate and temperature are thereafter adjusted appropriately, so that a single crystal ingot 112 having a substantially cylindrical shape can be obtained.

The above quartz crucible and graphite crucible in the apparatus 101 for manufacturing a single crystal both have high heat resistance, but the disadvantage in that the crucibles are comparatively brittle and lacking in impact resistance. When a single crystal is pulled, accordingly, the crucible 103, in some cases, is cracked due to the impact caused when a polycrystalline raw material is introduced into the crucible 103, and the raw material melt 109 leaks therefrom.

In addition, in some cases, the melt in the crucible 103 is splashed around the crucible 103 upon the introduction of the polycrystalline raw material. When the crucible 103 deteriorates gradually through use or the single crystal 112 falls down during pulling, there is a risk of leak of substantially the entire melt due to damage to the crucible 103.

In view of these, a single-crystal pulling apparatus disclosed in Patent Document 1, for example, is provided with, at the bottom of the main chamber 102, a melt-leakage receiving tray 113 having a sufficient internal volume to contain the entire raw material melt.

CITATION LIST

Patent Literature

Patent Document 1: Pamphlet of International Publication No. WO2001/064976

SUMMARY OF INVENTION

Technical Problem

In the conventional apparatus 101 for manufacturing a single crystal as shown in FIG. 4, an electrode 114 is coupled with the cylindrical heater 104 through a clamp and the like to supply electric power to the heater. The electrode 114 is inserted from the bottom of the main chamber 102 and supports the cylindrical heater 104 from below.

The inventor investigated the electrode. Considering downsizing and thermal efficiency of an apparatus for manufacturing a single crystal, the apparatus is designed such that an electrode coupled with a cylindrical heater is located at the vicinity right below a crucible configured to contain a raw material melt. The inventor found that when the raw material melt leaks from the crucible, this structure allows the electrode to be splashed with the melt from above, and therefore entails a potential risk of damaging the electrode, which is made of metal and cooled with wafer.

The present invention was accomplished in view of the above-described problems. It is an object of the present invention to provide an apparatus for manufacturing a single crystal that can protect the electrode that supports the cylindrical heater from the raw material melt leaking from the crucible.

Solution to Problem

To achieve this object, the present invention provides an apparatus for manufacturing a single crystal according to a Czochralski method, comprising: a crucible configured to contain a raw material melt; a cylindrical heater surrounding the crucible, the heater being configured to heat the raw material melt; a main chamber that accommodates the crucible and the heater; an electrode that is inserted from the bottom of the main chamber and supports the cylindrical heater, the electrode being configured to supply electric power to the heater; and a melt-leakage receiving tray disposed on the bottom of the main chamber, the tray being configured to receive the raw material melt leaking from the crucible, wherein a melt-leakage cover is disposed below the crucible and above the electrode, the cover being configured to prevent contact between the raw material melt leaking from the crucible and the electrode.

Even when the raw material melt leaks from the crucible, this inventive apparatus for manufacturing a single crystal enables the melt-leakage cover to prevent the contact between the leaking raw material melt and the electrode. The apparatus can thereby protect the electrode from the raw material melt and inhibit damage to the electrode due to the raw material melt.

In a conventional apparatus for manufacturing a single crystal, when a raw material melt enters a coupling part between a cylindrical heater and an electrode and sticks thereon, the cylindrical heater cannot be taken out later; the cylindrical heater and the coupling part therefore needs to be broken to take out the heater. The melt-leakage cover can however prevent contact of the raw material melt with not only the electrode but also the heater and the coupling part, enabling them to be taken out without being broken.

In addition, the structure in which the electrode or the coupling part with the electrode can be seen from an upper high-temperature portion, such as a heat generating portion, of the cylindrical heater means that there exists a thermal conduction route and radiant heat from the cylindrical heater can escape to a lower location of the main chamber. In a conventional apparatus for manufacturing a single crystal, accordingly, this leads to reduced thermal efficiency, high cost, and a high environmental load. Provision of the melt-leakage cover however enables the heat from the cylindrical heater to be prevented from escaping to the lower location, thereby enabling the raw material melt to be efficiently heated.

Moreover, the melt-leakage cover may have a ring shape.

Such an apparatus allows the melt-leakage cover to be disposed along the entire circumference of the crucible, thereby enabling contact of the raw material melt with the electrode and the other lower components to be prevented regardless of the position at which the raw material melt has leaked from the crucible. In addition, the raw material melt can be more efficiently heated.

Moreover, the melt-leakage receiving tray may be provided with a melt-leakage detector for detecting the leakage of melt, and the melt-leakage cover may have a structure that guides the raw material melt leaking from the crucible toward the melt-leakage detector.

Such an apparatus can detect the occurrence of leakage of melt itself, thereby enabling immediate response, such as power down, and an effective, proper evasion action to be immediately taken.

Moreover, a heat-insulating plate through which the electrode extends may be disposed between the melt-leakage receiving tray and the melt-leakage cover, the melt-leakage cover may have a structure that guides the raw material melt leaking from the crucible toward the heat-insulating plate, and the heat-insulating plate may have a structure that guides the raw material melt toward the melt-leakage detector provided in the melt-leakage receiving tray.

Such an apparatus can guide the leaking raw material not toward the electrode but toward the heat-insulating plate, thereby enabling more reliable prevention of the contact between the raw material and the electrode.

In addition, the heat-insulating plate enables the heat radiating from above to be prevented from escaping to below, so the raw material melt can be more efficiently heated.

Then, the raw material melt can be guided toward the melt-leakage detector from the heat-insulating plate; thereby the occurrence of leakage of melt itself can be detected.

Moreover, the structure of the melt-leakage cover that guides the raw material melt may have a rib disposed at a periphery of an upper surface of the cover and a notch formed in part of the rib.

Such an apparatus can temporarily hold the raw material melt on the upper surface by the rib and then readily guide the raw material melt through the notch to the exterior of the melt-leakage cover.

Advantageous Effects of Invention

As described above, the inventive apparatus for manufacturing a single crystal can protect the electrode and the coupling part between the electrode and the cylindrical heater from the raw material melt leaking from the crucible. In addition, the apparatus can reduce heat that has radiated from the cylindrical heater and will escape to a lower location from an upper location at which the crucible is provided, thereby enabling the raw material melt to be efficiently heated.

DESCRIPTION OF EMBODIMENTS

An embodiment of the inventive apparatus for manufacturing a single crystal will now be described in detail by way of example with reference to the drawings, but the present invention is not limited to this embodiment.

Figure 1:
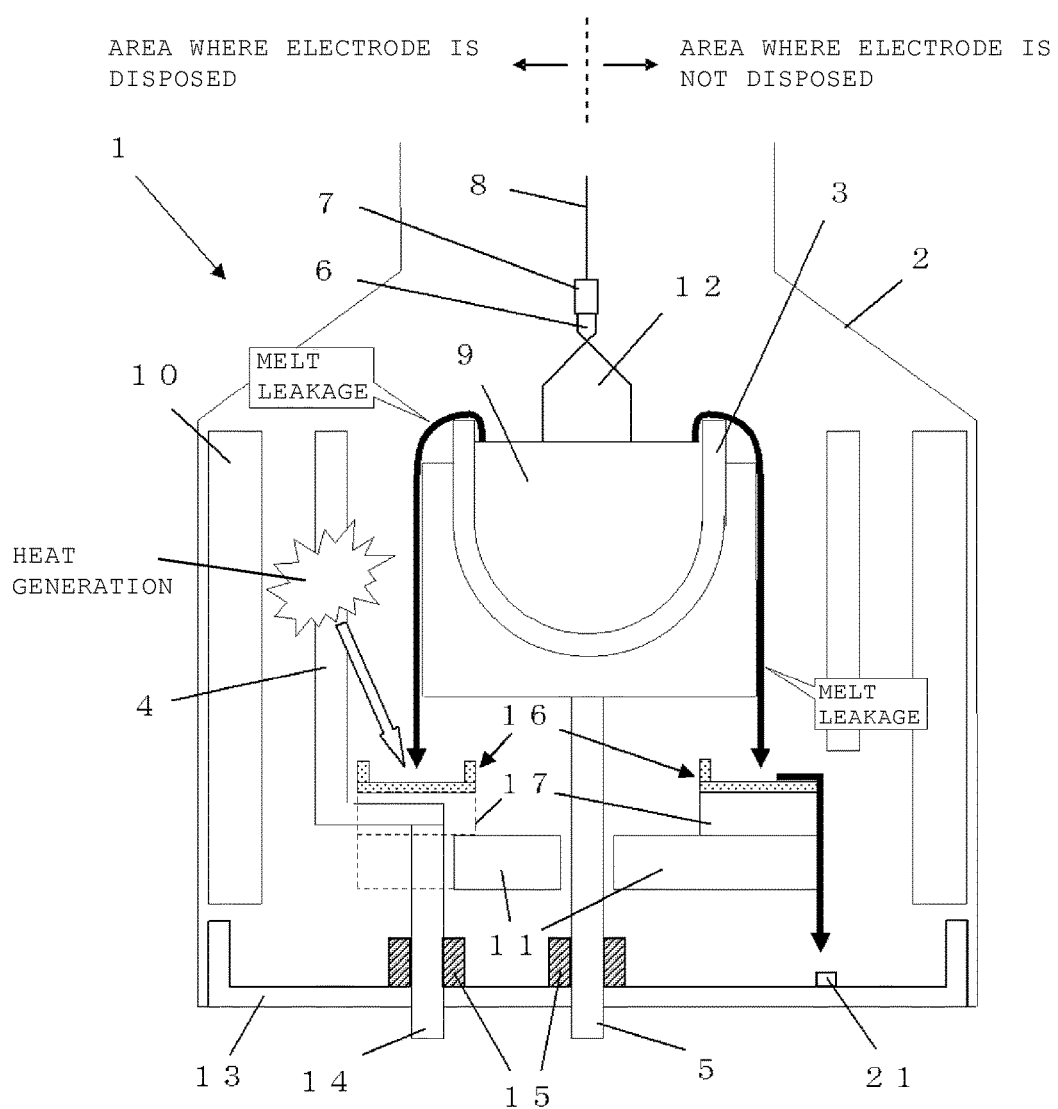
FIG. 1 is a schematic diagram of an exemplary apparatus for manufacturing a single crystal according to the present invention.

FIG. 1 schematically shows an exemplary apparatus for manufacturing a single crystal according to the present invention. The apparatus manufactures a single crystal, such as a silicon single crystal, according to the CZ method.

As shown in FIG. 1, the apparatus 1 for manufacturing a single crystal includes a main chamber (a pulling chamber) 2, a crucible 3 accommodated in the main chamber 2, a cylindrical heater 4 (simply referred to as a heater, hereinafter) disposed so as to surround the crucible 3, a crucible holding shaft 5 and its rotation mechanism (not shown) for rotating the crucible 3, a seed chuck 7 for holding a silicon seed crystal 6, a wire 8 for pulling the seed chuck 7, a winding mechanism (not shown) for rotating or winding the wire 8. The wire 8 is reeled up to pull the seed crystal 6 that has been brought into contact with or dipped into a raw material melt 9 (a molten material), such as a silicon melt here, contained in the crucible 3, so that a silicon crystal 12 can be grown.

The crucible 3 is composed of a quartz crucible disposed on the inside on which the raw material melt 9 is received and a graphite crucible disposed on the outside. A heat-insulating material 10 is also disposed around the outside of the heater 4.

Moreover, a melt-leakage receiving tray 13 having a sufficient internal volume to contain the entire raw material melt is disposed at the bottom of the main chamber 2.

Moreover, a water-cooled electrode 14 made of metal is inserted from the bottom of the main chamber 2. The electrode 14 is coupled with the heater 4 at its upper end though a clump and the like to serve as a support for the heater 4 and a supplier of electric power.

The electrode 14 and a crucible holding shaft 5 are surrounded and covered by a sleeve 15. The reason is that when the raw material melt leaking from the crucible reaches the melt-leakage receiving tray 13, the electrode 14 and the crucible holding shaft 5 will be protected from the leaking raw material melt.

The inventive apparatus 1 for manufacturing a single crystal is also provided with a melt-leakage cover 16 below the crucible 3 and above the electrode 14. A heat-insulating plate 11 may further be disposed between the melt-leakage cover 16 and the melt-leakage receiving tray 13.

The melt-leakage cover 16 will now be described in detail.

Since the melt-leakage cover 16 is disposed between the crucible 3 and the electrode 14, even when the raw material melt 9 in the crucible 3 leaks and drops toward the electrode 14, the melt will contact only the melt-leakage cover 16, which is disposed at a position higher than that of the electrode 14; it is possible to prevent the contact of the raw material melt with the electrode 14, which is disposed below the melt-leakage cover 16, and the coupling part between the electrode 14 and the heater 4. In this way, the electrode 14 made of metal, the coupling part, and so on can be protected from the raw material melt and prevented from damaging. Unlike a conventional apparatus, the inventive apparatus can thereby eliminate the need for breaking part of the heater 4 and the coupling part to which a raw material melt has stuck, when the heater 4 is taken out.

Since the melt-leakage cover 16 is provided, it is possible to inhibit an escape of heat radiating from the heater 4 into a lower location in the main chamber 2. The raw material melt in the crucible 3 can thereby be efficiently heated, and electric power needed upon manufacture can be reduced. The cost and environmental load can thereby be reduced.

The position at which the melt-leakage cover 16 is disposed need only be below the crucible 3 and above the electrode 14; the specific position is not particularly limited. The position may be, for example, 10 mm or more away from the crucible 3 downward and above the electrode 14, such as 10 mm or more away from the coupling part between the electrode 14 and the heater 4 upward. At such a position, the melt-leakage cover 16 does not interfere with the crucible 3, the electrode 14, and the coupling part and so on during operation; thereby the occurrence of spark due to a short can be prevented.

Other than that, the size, the shape, and the like of the melt-leakage cover 16 are not particularly limited, provided it has a sufficient size and shape to protect the electrode 14 from the leaking raw material melt. For example, the size may be the minimum size needed to cover only an upper part of the electrode 14; as shown in FIG. 2, the shape may be a ring shape that extends such that it is disposed along the entire circumference of the crucible 3.

Figure 2:
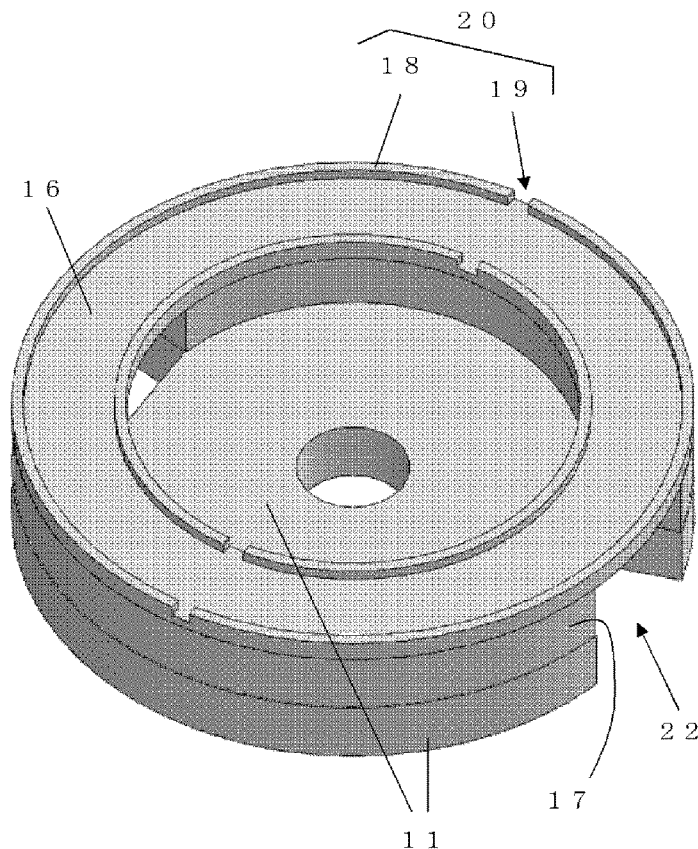
FIG. 2 is a schematic diagram of an exemplary melt-leakage cover.

In an example shown in FIG. 2, because of the ring shape, the crucible holding shaft 5 can extend through a center hole, and even when the raw material melt 9 leaks from any location of the crucible 3 located above, directly falling of the melt on a lower location in the main chamber 2 can be prevented. In addition, with respect to the cylindrical heater 4, an escape of the radiant heat into a lower location can be inhibited at any circumferential position, and the raw material melt 9 can thereby be more efficiently heated. The melt can even be heated with uniform thermal distribution in circumferential direction of the crucible 3.

The melt-leakage cover 16 is integrated with an heat-insulating plate 11 disposed below the cover. The electrode 14, for example, extends through the heat-insulating plate 11. In this embodiment, a member 17 having a proper thickness for use in height position adjustment is prepared separately. The member 17 for use in height position adjustment is placed on the heat-insulating plate 11 and the melt-leakage cover 16 is placed thereon. These components are fixed by engaging their fitting parts appropriately formed therein to prevent their positional differences.

As shown in FIG. 2, the heat-insulating plate 11 has an electrode-through hole 22 and is configured such that the electrode 14 can extend therethrough.

The melt-leakage cover 16 may be made of a graphite material; the member 17 for use in height position adjustment may be made of a heat-insulating material or a graphite material.

Without through the member 17 for use in height position adjustment, the melt-leakage cover 16 and the heat-insulating plate 11 can be directly integrated by proper adjustment of the thickness or the location of the melt-leakage cover 16 and the heat-insulating plate 11.

The melt-leakage cover 16 and the heat-insulating plate 11 can also be disposed independently.

Whether they are disposed integrally or independently may be appropriately decided according to the size of the main chamber 2, positional relationships among the other components, or the like.

The difference between the heat-insulating plate 11 and the melt-leakage cover 16 depends on whether they cover the upper part of the electrode 14 or not.

Moreover, a rib 18 is disposed along the circumference of the upper surface of the melt-leakage cover 16. The disposed rib 18 enables the raw material melt falling on the melt-leakage cover 16 to be temporally held.

A notch 19 is formed in part of the rib 18. The notch 19 allows the raw material melt held in an area surrounded by the rib 18 to flow downward therethrough. Together with adjustment of a location at which the notch 19 is formed, provision of the melt-leakage cover 16 such that the notch 19 is located right above a desired location into which the raw material melt flows enables the raw material melt to be guided to the desired location through the notch 19.

The guiding structure 20 for the leaking raw material melt in the melt-leakage cover 16 is not limited to the example in FIG. 2, but appropriately determined. Another practical example is a structure in which the raw material melt can flow downward through a through hole and the like formed in the melt-leakage cover 16.

The structure need only be capable of guiding the raw material melt to a desired location while preventing contact of the raw material melt with the electrode 14, the coupling part, and so on.

The guiding structure may be configured so as to guide the raw material melt to a melt-leakage detector 21 provided in the melt-leakage receiving tray 13. The melt-leakage receiving tray 13 may be configured such that it merely receives the raw material melt leaking from the crucible 3. In an example shown in FIG. 1, however, the melt-leakage detector 21 is provided to automatically detect the leakage of melt. Such an apparatus can detect the occurrence of the leakage of melt itself and immediately take an effective action, such as power down. The melt-leakage detector 21 can continuously detect the temperature of the melt-leakage receiving tray 13 and decide whether the leakage of melt has occurred, according to variation in detected values.

If the above guiding structure 20 of the melt-leakage cover 16 is configured to guide a raw material melt so as to directly flow near the melt-leakage detector 21, then a raw material melt that would flow into the coupling part between the heater 4 and the electrode 14, and so on in a conventional apparatus can also be guided to the melt-leakage detector 21. The leakage of melt can therefore be detected, or sometimes in a shorter time than previously. In the past, even through the melt-leakage detector is provided, it was not possible to detect the leakage of melt in the case where the leaking melt flows into the coupling part, and so on.

The guiding structure 20 of the melt-leakage cover 16 may also be configured such that the raw material melt is guided so as to flow first toward the heat-insulating plate 11 and then near the melt-leakage detector 21 through the heat-insulating plate 11. In this configuration, the heat-insulating plate 11 is preferably provided with a similar guiding structure to that of the melt-leakage cover 16.

The this type of melt-leakage cover 16 and heat-insulating plate 11 allows the raw material melt 9 leaking from the crucible 3 to be finally guided to the melt-leakage detector 21 with the guiding structure 20 of the melt-leakage cover 16 and the heat-insulating plate 11. The ability to detect the leakage of melt thereby becomes excellent.

EXAMPLE

The present invention will now be more specifically described with reference to example and comparative example, but the present invention is not limited to this example.

Example

A silicon single crystal was manufactured with the inventive apparatus 1 for manufacturing a single crystal, provided with a graphite melt-leakage cover as shown in FIG. 1.

Polycrystalline silicon of 140 kg was charged into a quartz crucible with a diameter of 61 cm, and melted. A horizontal magnetic field with a central intensity of 0.4T was applied. Through a process for maturing the silicon melt, a seed crystal having a (001) plane was dipped into the silicon melt.

At this time, the flow rate of Ar was adjusted to 120 L/min. The pressure in the apparatus for manufacturing a single crystal was adjusted to 75 Torr (9999 Pa) by resistance provided in an exhaust pipe. After a necking process, the diameter of the single crystal was increased to a desired diameter of 200 mm. A boron-doped, 200 mm-diameter silicon single crystal was then grown in which the specific resistance of a constant diameter portion, which became a product, was adjusted to 10 Ω·cm.

Figure 3:
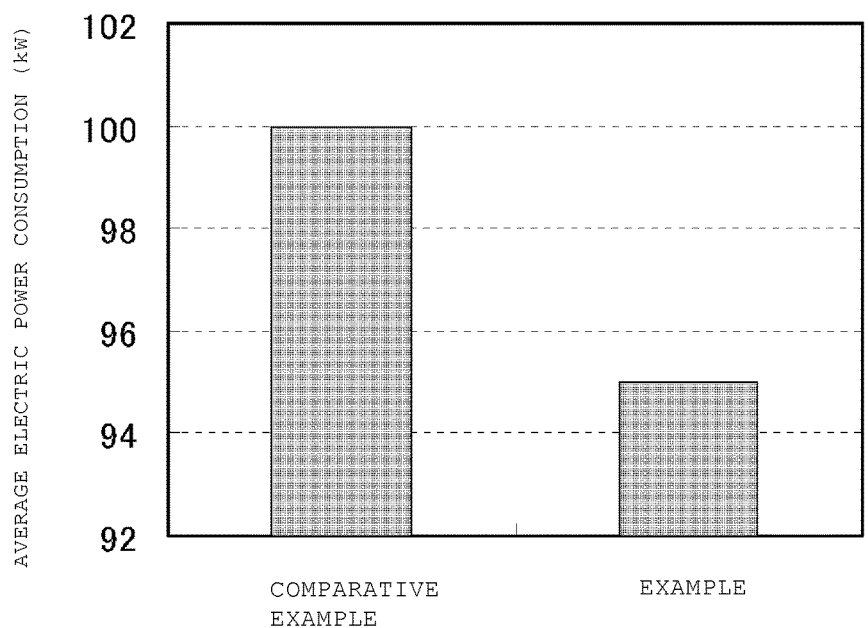
FIG. 3 is a graph showing the result of electric power consumption in example and comparative example.

The average electric power consumed in the growth of this silicon single crystal was investigated. The result is shown in FIG. 3. As shown in FIG. 3, the result was 95 kW. The average electric power consumption was lower than that in the later-described comparative example. This is considered to be because in this example, the melt-leakage cover was disposed above the electrode to prevent radiant heat from the heater from escaping into below the melt-leakage cover, particularly into a lower location of the main chamber through the electrode-through hole of the heat-insulating plate; thereby the silicon melt was efficiently heated, unlike the comparative example using a conventional apparatus for manufacturing a single crystal.

Comparative Example

Figure 4:
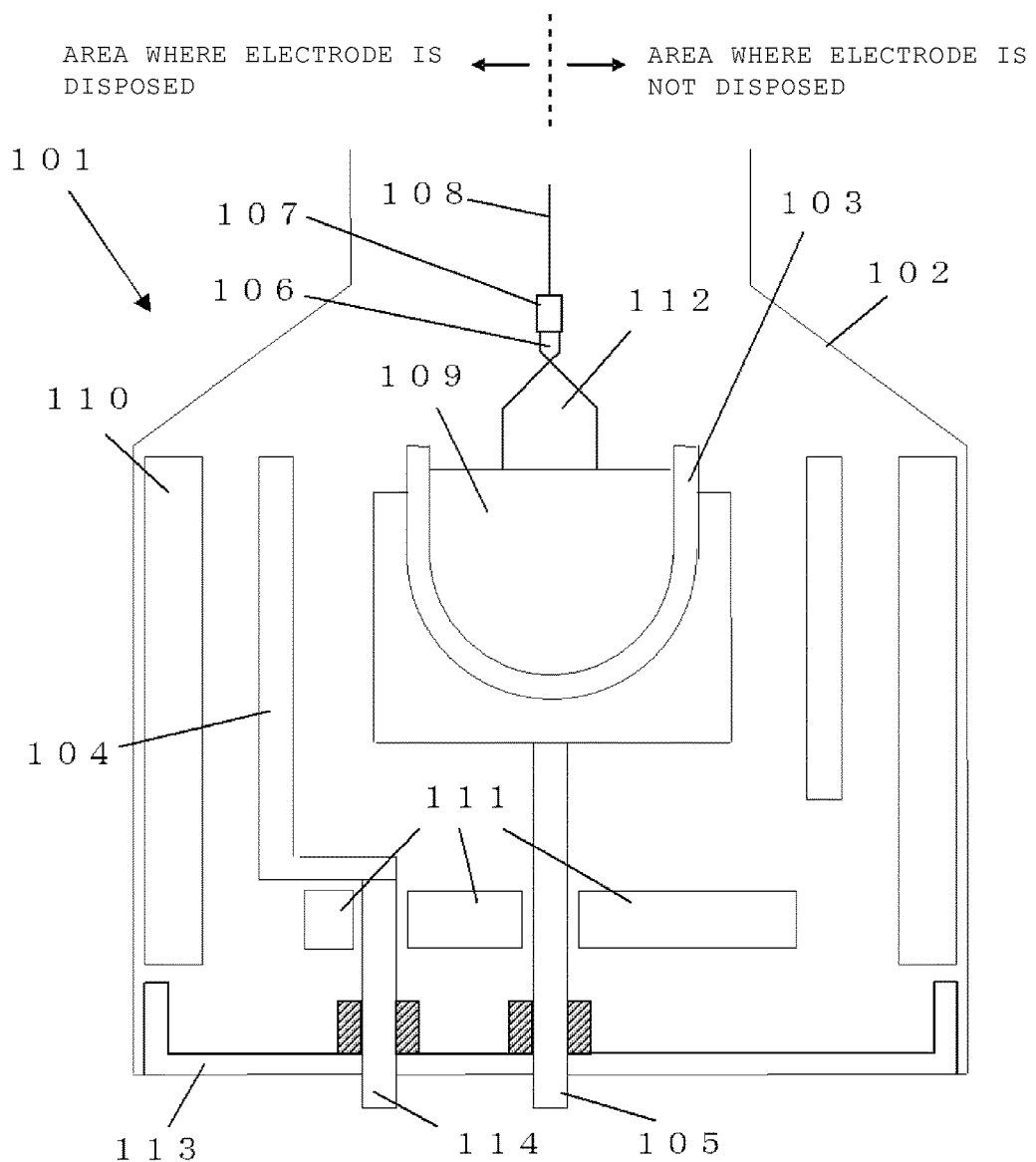
FIG. 4 is a schematic diagram of an example of a conventional apparatus for manufacturing a single crystal.

A silicon single crystal was manufactured with the conventional apparatus 101 for manufacturing a single crystal, as shown in FIG. 4, in which no melt-leakage cover was provided.

The other operational conditions were the same as in the above example.

As shown in FIG. 3, the average electric power consumed in the growth of this silicon single crystal was 100 kW. The average electric power consumption was higher than that in the above example of the present invention.

It is to be noted that the leakage of melt occurred during operation. The apparatus 101 for manufacturing a single crystal in comparative example allowed the raw material melt to contact the electrode and so on, whereas the apparatus 1 for manufacturing a single crystal in the above example protected the electrode from the raw material melt with the melt-leakage cover.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. An apparatus for manufacturing a single crystal according to a Czochralski method, comprising:
   a crucible configured to contain a raw material melt;
   a cylindrical heater surrounding the crucible, the heater being configured to heat the raw material melt;
   a main chamber that accommodates the crucible and the heater;
   an electrode that is inserted from the bottom of the main chamber and supports the cylindrical heater, the electrode being configured to supply electric power to the heater; and
   a melt-leakage receiving tray disposed on the bottom of the main chamber, the tray being configured to receive the raw material melt leaking from the crucible, wherein
   one melt-leakage cover is disposed below the crucible and above the electrode, the cover being configured to prevent contact between the raw material melt leaking from the crucible and the electrode and having a ring shape that extends such that the cover is disposed along the entire circumference of the crucible,
   a heat-insulating plate through which the electrode extends is disposed between the melt-leakage receiving tray and the melt-leakage cover,
   the melt-leakage cover has a structure that guides the raw material melt leaking from the crucible toward the heat-insulating plate, and
   the heat-insulating late has a structure that guides the raw material melt toward the melt-leakage detector provided in the melt-leakage receiving tray.

2. The apparatus for manufacturing a single crystal according to claim 1, wherein the melt-leakage receiving tray is provided with a melt-leakage detector for detecting the leakage of melt, and the melt-leakage cover has a structure that guides the raw material melt leaking from the crucible toward the melt-leakage detector.

3. The apparatus for manufacturing a single crystal according to claim 2, wherein the structure of the melt-leakage cover that guides the raw material melt has a rib disposed at a periphery of an upper surface of the cover and a notch formed in part of the rib.

4. The apparatus for manufacturing a single crystal according to claim 1, wherein the structure of the melt-leakage cover that guides the raw material melt has a rib disposed at a periphery of an upper surface of the cover and a notch formed in part of the rib.

* * * * *

UNITED STATES PATENT AND TRADEMARK OFFICE
CERTIFICATE OF CORRECTION

PATENT NO. : 9,708,729 B2
APPLICATION NO. : 14/401345
DATED : July 18, 2017
INVENTOR(S) : Toshiro Shimada It is certified that error appears in the above-identified patent and that said Letters Patent is hereby corrected as shown below:

On the Title Page

Change item (73) to:
(73) Assignee: SHIN-ETSU HANDOTAI CO., LTD.,
Tokyo (JP)

Signed and Sealed this
Twenty-sixth Day of February, 2019

Andrei Iancu
*Director of the United States Patent and Trademark Office*